United States Patent [19]
Blanchard et al.

[11] Patent Number: 4,920,388
[45] Date of Patent: Apr. 24, 1990

[54] POWER TRANSISTOR WITH INTEGRATED GATE RESISTOR

[75] Inventors: Richard A. Blanchard, Los Altos; Adrian I. Cogan, San Jose, both of Calif.

[73] Assignee: Siliconix Incorporated, Santa Clara, Calif.

[21] Appl. No.: 246,937

[22] Filed: Sep. 19, 1988

Related U.S. Application Data

[63] Continuation of Ser. No. 14,962, Feb. 17, 1987, abandoned.

[51] Int. Cl.⁵ .................. H01L 29/78; H01L 27/02; H01L 29/04
[52] U.S. Cl. .................. 357/23.4; 357/23.8; 357/23.14; 357/41; 357/49; 357/50; 357/51; 357/59
[58] Field of Search .......... 357/51, 23.4, 23.14, 357/23.8, 59 E, 59 F, 59 G, 41, 49, 50

[56] References Cited

U.S. PATENT DOCUMENTS

| | | |
|---|---|---|
| 3,999,210 | 12/1976 | Yamada . |
| 4,157,563 | 6/1979 | Bosselaar ........................... 357/51 |
| 4,181,913 | 1/1980 | Thornburg .......................... 357/51 |
| 4,333,225 | 6/1982 | Yeh ................................. 357/23.4 |
| 4,352,997 | 10/1982 | Raymond Jr. et al. ........... 357/59 E |
| 4,451,328 | 5/1984 | Dubois ............................. 357/51 |
| 4,467,519 | 8/1984 | Glang et al. ...................... 357/51 |
| 4,471,374 | 9/1984 | Hardee et al. .................... 357/51 |
| 4,490,734 | 12/1984 | Yamada ............................ 357/52 |
| 4,589,004 | 5/1986 | Yasuda et al. .................... 357/23.8 |
| 4,602,170 | 7/1986 | Berhn .............................. 357/23.14 |
| 4,760,434 | 7/1988 | Tsuzhki et al. ................... 357/23.8 |

FOREIGN PATENT DOCUMENTS

| | | | |
|---|---|---|---|
| 58-200563 | 11/1983 | Japan .............................. 357/51 |
| 60-137065 | 7/1985 | Japan .............................. 357/23.8 |
| 60-171771 | 9/1985 | Japan . |

OTHER PUBLICATIONS

"A High Power MOS-FET With a Vertical Drain Electrode and Meshed Gate Structure", I. Yoshida et al., Japanese Journal of Applied Physics Supp., vol. 15, No. 7, 1976, pp. 179-183.

*Primary Examiner*—Andrew J. James
*Assistant Examiner*—Ngan Van Ngo
*Attorney, Agent, or Firm*—Skjerven, Morrill, MacPherson, Franklin & Friel

[57] ABSTRACT

A power MOS transistor includes a polycrystalline silicon layer which provides connection to act as a resistor between a first portion of gate metallization disposed above the gate of the device, and a second portion of gate metalization adjacent to the active source/gate region of the device.

3 Claims, 2 Drawing Sheets

POWER TRANSISTOR WITH INTEGRATED GATE RESISTOR

This application is a continuation of application Ser. No. 07/014,962, filed Feb. 17, 1987 now abandoned.

BACKGROUND OF THE INVENTION

This invention relates generally to transistors, and more particularly, to a transistor having an integrated gate resistor.

In applications requiring the paralleling of power MOS transistors (whether lateral or vertical devices), the high gain, high frequency characteristics of these devices make them prone to oscillation. In the past, two techniques have been used to reduce unwanted oscillation:
1. The gate geometry may be designed so that its distributed resistance minimizes the occurrence of the oscillations, or
2. A resistor may be placed in series with portions of the gate metallization of the transistor.

While both of these techniques have been found effective, each has certain disadvantages.

The presence of distributed gate resistance has been found to slow the propagation of the gate drive signal across the device when rapid turn on or turn off is required This distributed resistance establishes a minimum device response time which may be unsatisfactory.

The use of an external resistor in series with portions of the gate metallization increases device complexity and make also require additional chip area.

SUMMARY OF THE INVENTION

It is an object of this invention to overcome the problems set forth above.

The present invention is directed to the inclusion, in a power transistor, of a resistor between the gate pad and the active path region of the device, which resistor is integrated as part of the device.

Broadly stated, in accordance with this invention a power transistor is provided with an integrated gate resistor comprising a semiconductor substrate having a first region of a first conductivity type and a second region of a second conductivity type adjacent the first region, and forming a junction with the first region, an insulating layer over at least a portion of the first region and at least a portion of the second region, a first conductive gate element adjacent the first region, with the insulating layer between the first conductive gate element and the first region, a second conductive gate element adjacent the second region and spaced from the first conductive gate element, with the insulating layer between the substrate and second conductive gate element, and a resistor on the insulating layer contacting the first and second conductive elements.

The defined structure achieves significant reduction of device oscillation, without slowing of propagation of the gate drive signal across the device when rapid turn on and turn off is required, and avoids complexity, and use of additional chip area over the standard device.

BRIEF DESCRIPTION OF THE DRAWINGS

Other objects and advantages of the invention will become apparent from a study of the following specification and drawings, in which.

DETAILED DESCRIPTION OF THE INVENTION

Figure 1:
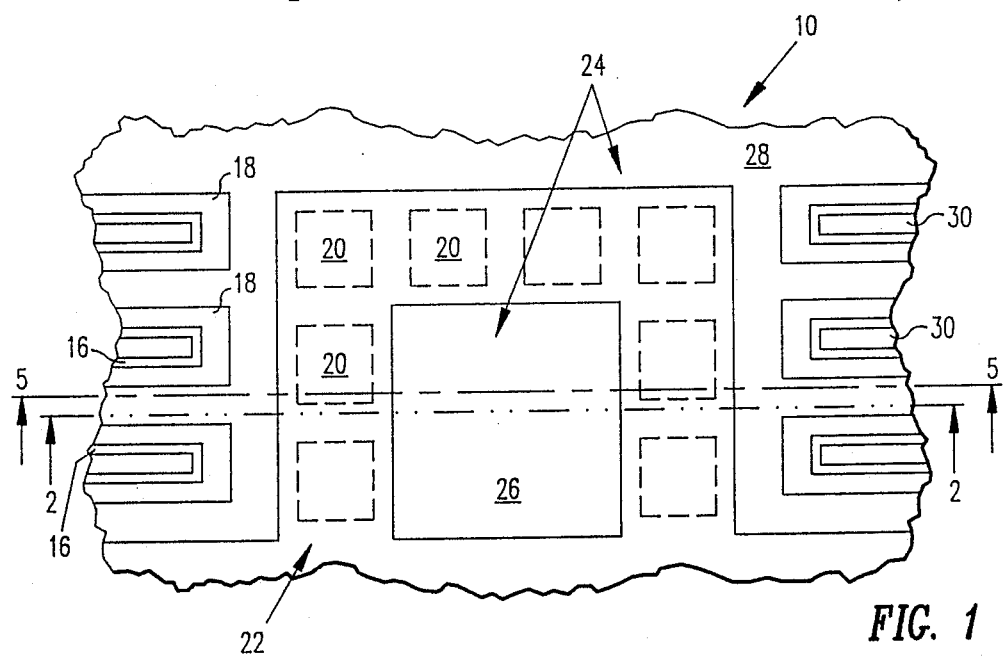
FIG. 1 is a plan view of an interdigitated vertical DMOS power transistor incorporating the invention.

Referring to the drawings, a DMOS power transistor 10 is shown therein. Such device 10 includes a semiconductor substrate 12 of N conductivity type, and a region of P conductivity type 14 formed therein as a gate pad so the region 14 is generally surrounded by N conductivity type region 13, and forms a P-N junction with the region 13. A thick layer of oxide 16 (in order to minimize capacitance) is formed over the surface of the substrate 12, covering the P-region 14 and at least a portion of the N-region 13 adjacent the P-region 14.

A layer of doped polycrystalline silicon 18 is formed over the oxide layer 16, and openings 20 are provided therethrough (FIG. 1). As shown in FIG. 1, the openings 20 are substantially rectangular in shape and are substantially uniform in size.

An additional oxide layer 22 is provided over the polycrystalline silicon layer 18 and is patterned to define contact windows for gate metallization 24. Such gate metallization 24 is provided in the patterns shown in the drawings. The gate metallization 24 is of conductive metal (for example, aluminum) and has a first portion 26 positioned adjacent and generally over the region 14, and a second portion 28 generally surrounding the first portion 26 and adjacent and generally over the region 13.

The gate metallization portion 28, polycrystalline silicon layer 18, and oxide layer 16 are further patterned to determine openings therein so that source metallization portions 30 can contact as appropriate the region 13 of the device 10.

In the use of the device 10, the portion of polycrystalline silicon layer 18 extending between the edges 26a, 28a of metallization portions 26, 28, respectively, acts as a resistor element contacting those conductive elements 26, 28 and extending therebetween. As seen in FIG. 1, the areas of doped polycrystalline silicon layer 18 between the openings 20 are regions having electrical resistance, which are part of the resistor element. In fact, the layout of the device 10 is such that the effective resistor dimension of the resistor element extends from the edge 26a of the metallization portion 26 to the edge 28a and to adjacent the junction of the regions 14, 13.

The size of the openings in the polycrystalline silicon layer 18, along with the effective dimensions of the resistor element as described above and the doping level of the polycrystalline silicon layer 18, may all be varied and chosen as appropriate to the specific device and application thereof.

For example, in a specific environment, doping with arsenic to the level of $10^{15}$ atoms/cm$^3$ can provide a sheet resistance of 1000 ohms/sq. while doping with arsenic to a level of $10^{16}$ atoms/cm$^3$ can provide a sheet resistance of 100 ohms/sq. Boron and phosphorous, or combination of the these dopants, can also be used.

Figure 2:
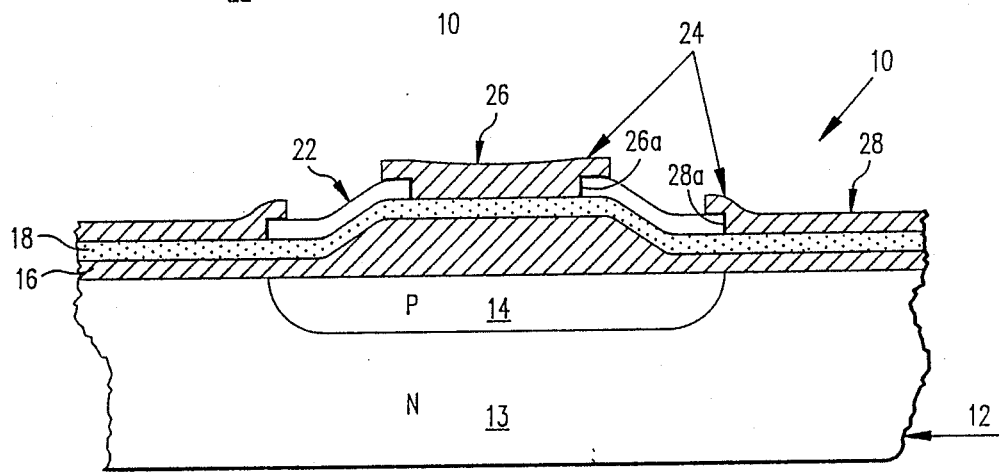
FIG. 2 is a sectional view taken along the line 2—2 of FIG. 1.
Figure 3:
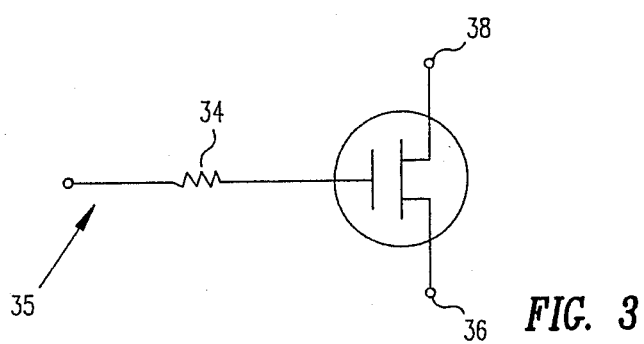
FIG. 3 is a schematic view of a transistor incorporating the invention.
Figure 4:
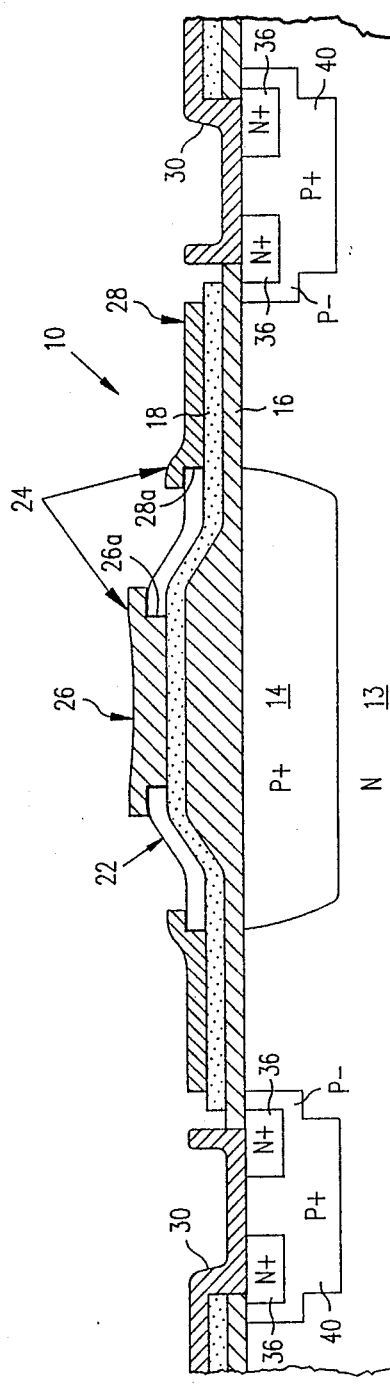
FIG. 4 is a sectional view taken along line 2—2 of FIG. 1 extending further to left and right to show the source, body, and drain regions of the invention.

The resulting circuit of the device of the present invention is set forth in FIG. 3, showing a resistor 34 in the gate line 35, and a source 36 and drain 38. FIG. 4 shows a sectional view as in FIG. 2, also showing the source metallizations 30, source regions 36, drain region 13, body regions 40, and drain contact 42 on the underside of the substrate of the vertical DMOS power transistor.

Figure 5:
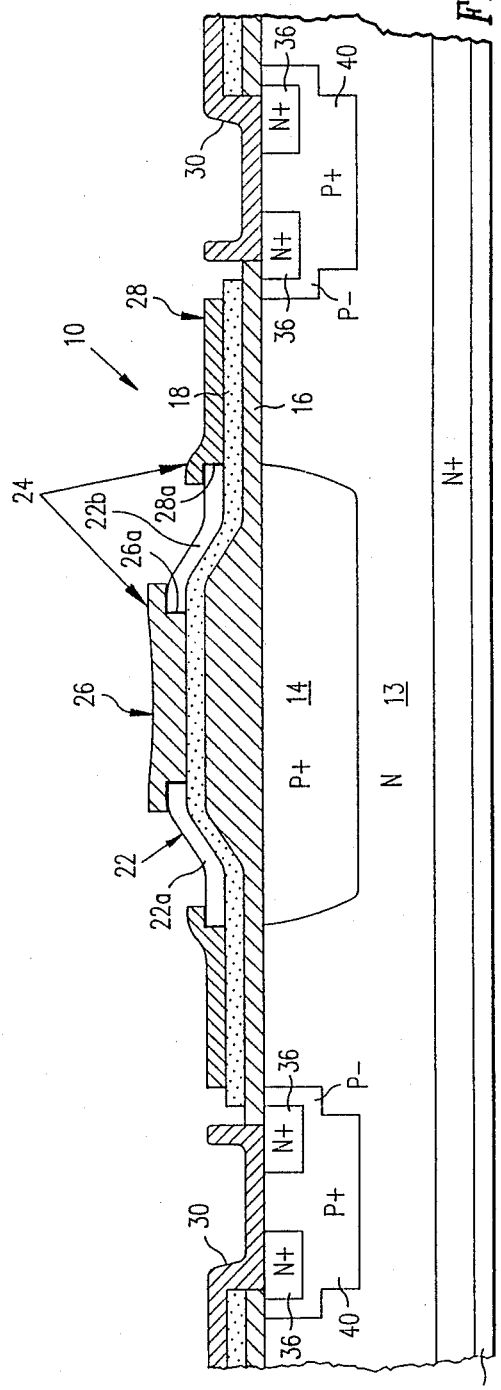
FIG. 5 is a sectional view taken along line 5—5 of FIG. 1.

FIG. 5 shows a sectional view as along line 5—5 in FIG. 1 showing how portions of additional oxide layer 22 designated as 22a, 22b penetrate through the openings 20 (see FIG. 1) in polycrystalline silicon layer 18 to contact oxide layer 16 and thus isolate, in this cross section, the portion of polycrystalline silicon layer 18 underlying gate metallization portion 26.

In this manner the use of a resistor that is integrated into the device between gate metallization portions of the power MOS transistor and extending to the active source-gate junction adds the series resistance needed to prevent unwanted oscillations of the device.

Meanwhile, since valuable chip area is saved, the resulting small die size provides the advantages of high speed operation, along with high yield end resulting low cost of the device.

In applications requiring the use of power MOS transistors in serial, direct metallization connections between the gate metallization portions 26, 28 can be made, bypassing the resistor structure described.

We claim:

1. A vertical DMOS power transistor with an integrated gate resistor comprising:

a semiconductor substrate having a first region of a first conductivity type and a second region of a second, opposite conductivity type generally surrounding the first region and forming a junction with the first region;

an insulting layer on the substrate over the first region and at least a portion of the second region;

a doped polycrystalline silicon layer on the insulating layer a portion of which acts as a gate;

a first conductive gate element on the polycrystalline silicon layer and positioned generally over the first region;

a second conductive gate element on the polycrystalline silicon layer and spaced from and generally surrounding the first conductive gate element;

a drain contact on the substrate and spaced apart from the insulating layer; and the portion of the polycrystalline silicon layer connecting the first and second conductive gate elements being a resistor element having a plurality of openings provided therethrough, the polycrystalline silicon layer thereby including a plurality of resistor regions, each of said resistor regions being connected to said first conductive gate element and said second conductive gate element, and whereby a resistance of said resistor element is a function of the sizes of said openings.

2. The device of claim 1, wherein each of said openings is substantially rectangular in shape.

3. The device of claim 1, wherein said openings are of substantially uniform size.

* * * * *